US 6,610,993 B2

(12) United States Patent
Meyhofer et al.

(10) Patent No.: US 6,610,993 B2
(45) Date of Patent: *Aug. 26, 2003

(54) LOAD PORT DOOR ASSEMBLY WITH INTEGRATED WAFER MAPPER

(75) Inventors: Eric Meyhofer, Palo Alto, CA (US); Kenneth A. Hardy, San Jose, CA (US); Cyril M. Kindt, Sunnyvale, CA (US); Torben J. H. Ulander, Sunnyvale, CA (US)

(73) Assignee: Fortrend Engineering Corporation, Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/337,712

(22) Filed: Jun. 21, 1999

(65) Prior Publication Data

US 2003/0107011 A1 Jun. 12, 2003

(51) Int. Cl.[7] ............................................... G01N 21/86
(52) U.S. Cl. ................................................... 250/559.4
(58) Field of Search ........................ 250/559.4, 559.36, 250/559.33

(56) References Cited

U.S. PATENT DOCUMENTS 6,013,920 A  *  1/2000  Gordon et al. ......... 250/559.36
6,396,072 B1 *  5/2002  Meyhofer et al. .......... 250/239

* cited by examiner

Primary Examiner—Frank G. Font
Assistant Examiner—Andrew H. Lee
(74) Attorney, Agent, or Firm—D. E. Schreiber

(57) ABSTRACT

An apparatus for determining the presence or absence of wafers in a cassette, i.e. a wafer mapper, is integrated with a door assembly in a load port interface that separates a process environment from an operator environment. In one orientation, a port cover plate seals an opening that pierces a bulkhead, while a door panel rests horizontally on the operator environment side of the bulkhead. In this position, a cassette of wafers may be placed on an inside surface of the door panel, with the top of the stack being open. As the door rotates to a vertical position, the wafer stack moves through the bulkhead opening thereby entering the process environment. A moveable trolley, connected to or within the door, moves parallel to the wafer stack detecting the presence of wafers by sensing light scattered from wafer edges through a window in a cover plate of the door panel. In this way the apparatus determines each wafer's location and may provide that information to subsequent wafer manufacturing operations. A movable air jet on a side of the window opposite the trolley, magnetically coupled to the trolley, moves with the trolley to clear liquid droplets or particles from the process environment side of the window.

22 Claims, 8 Drawing Sheets

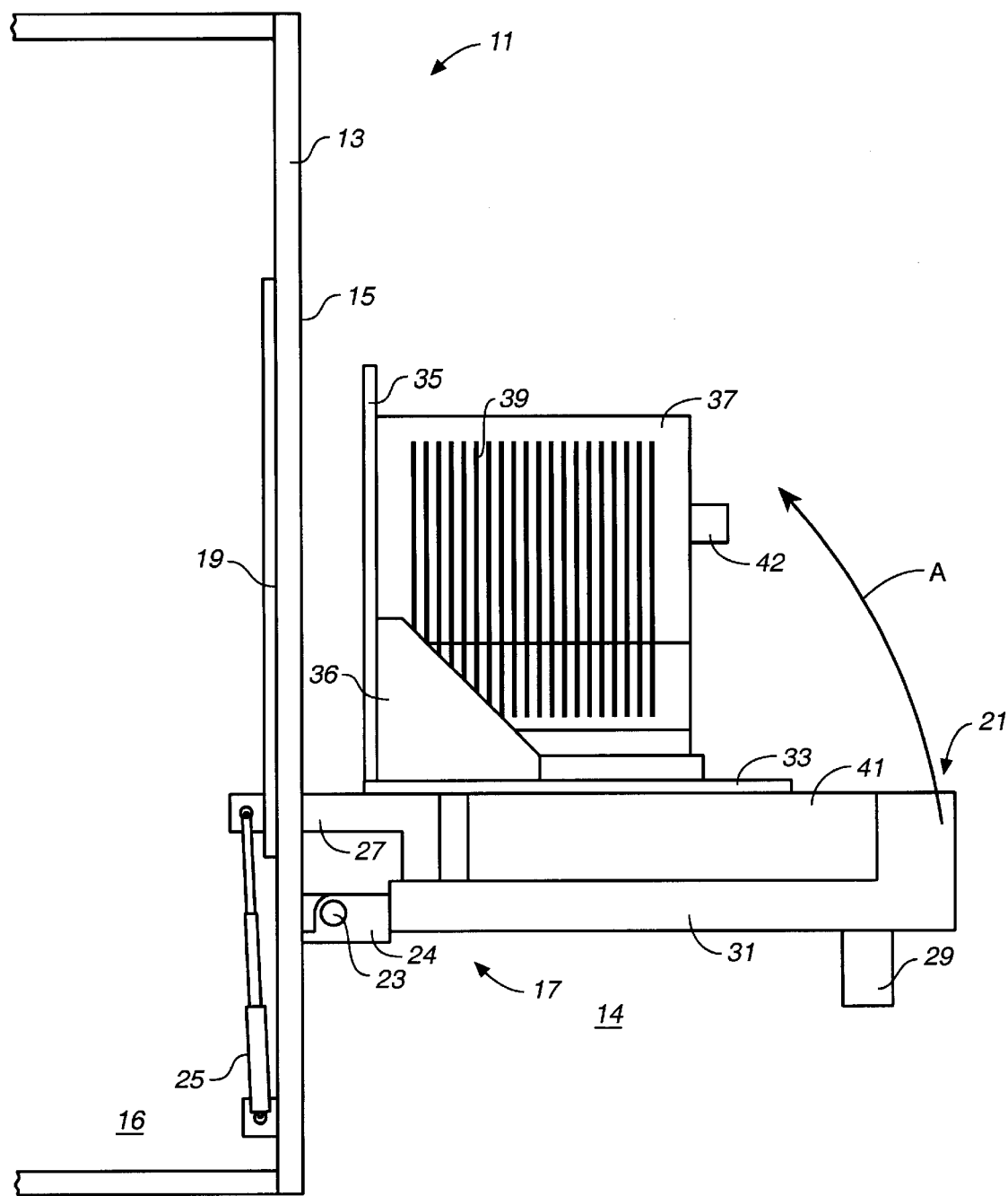
FIG._1

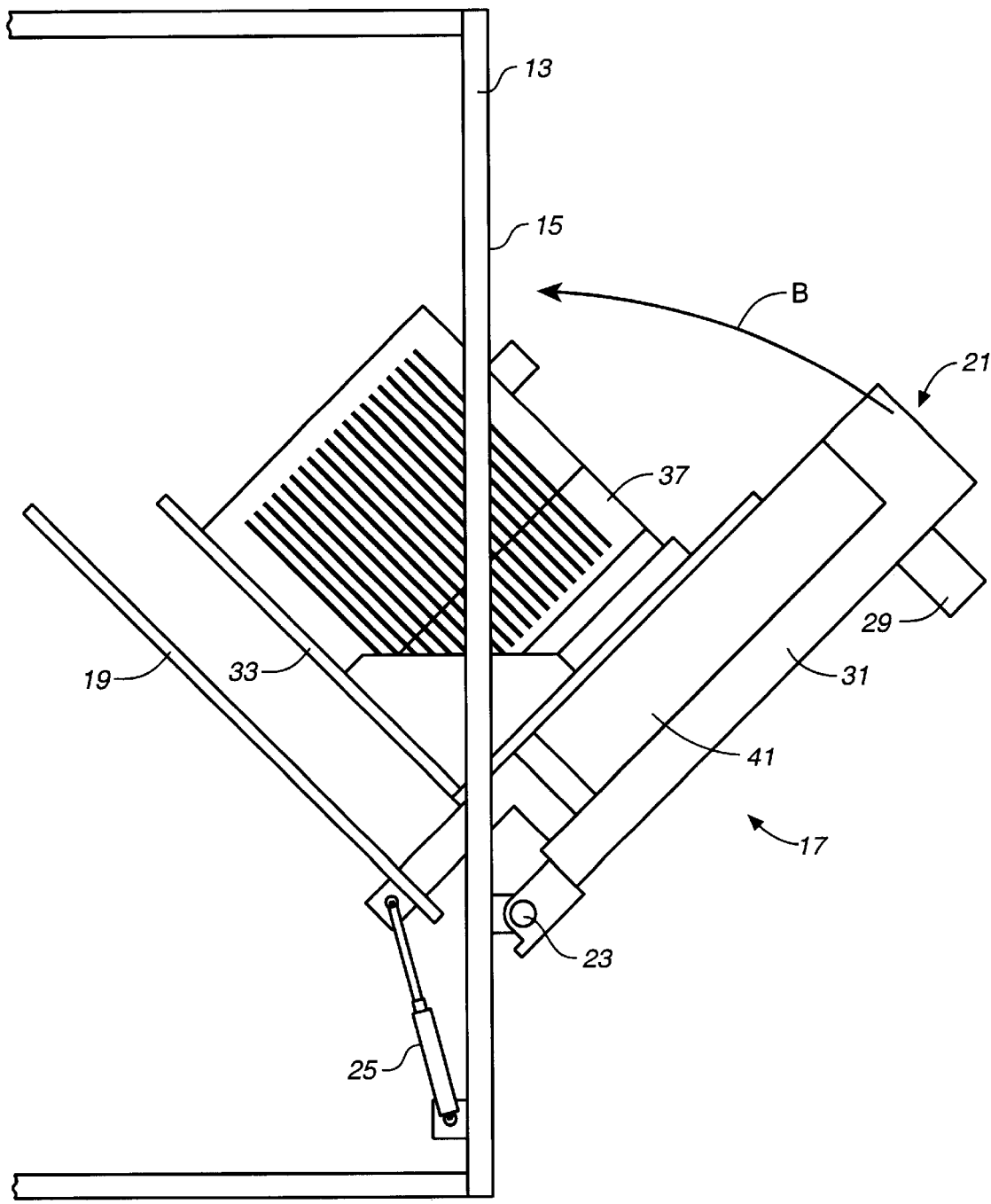
FIG._2

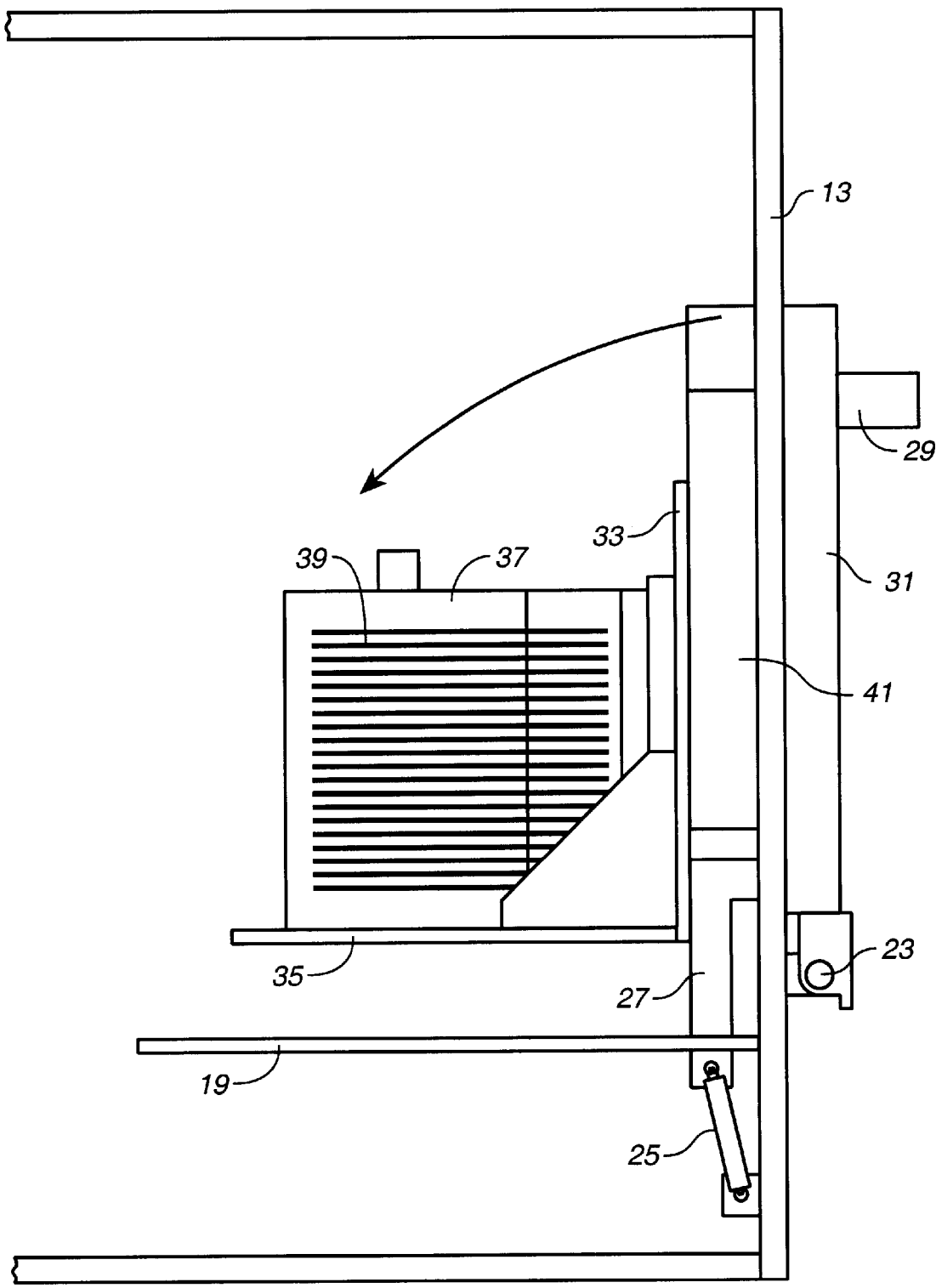
FIG._3

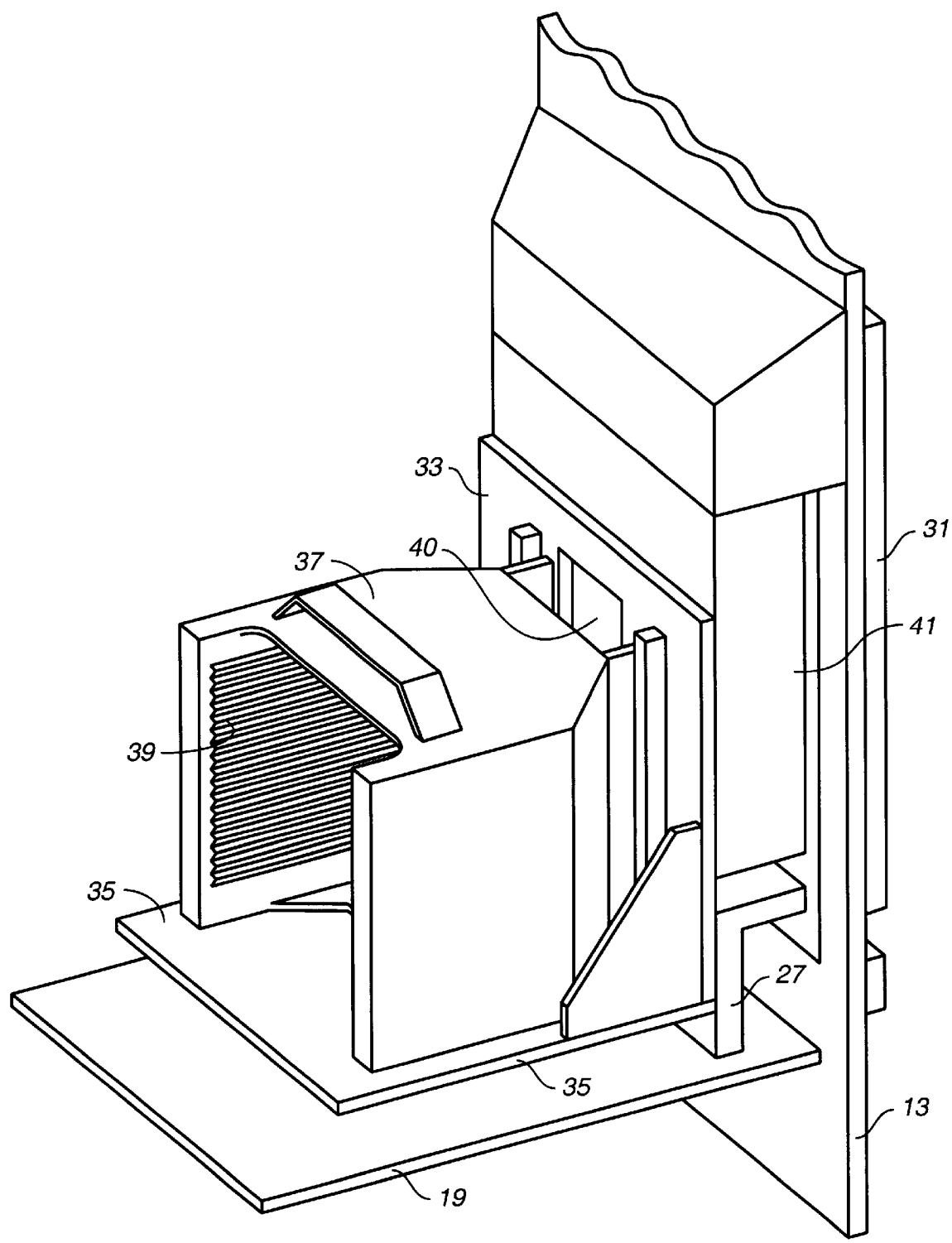
FIG._4

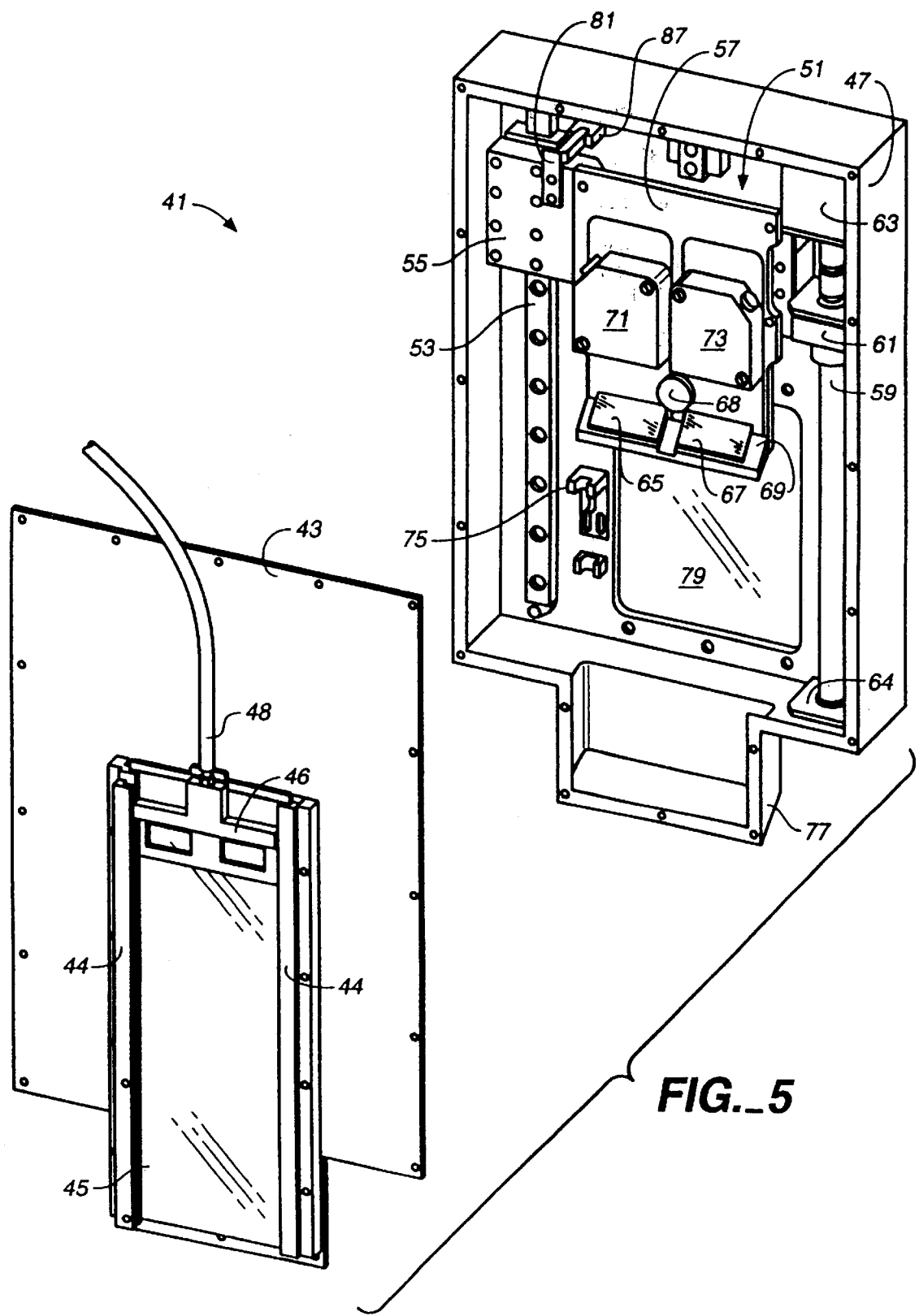
FIG._5

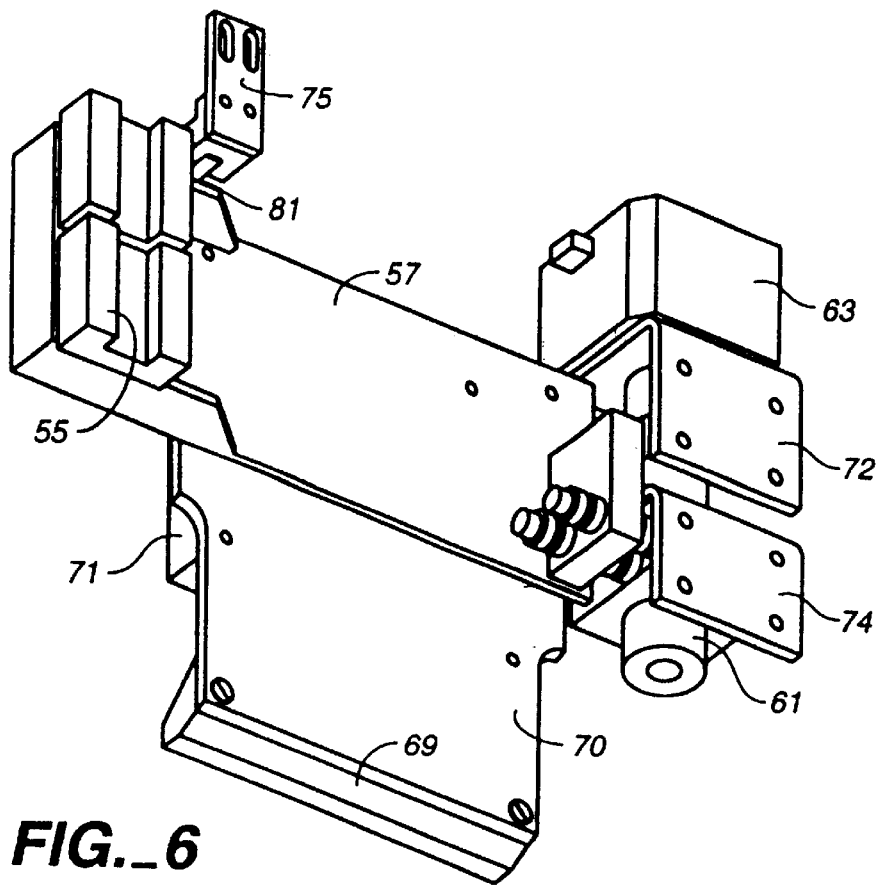
FIG._6
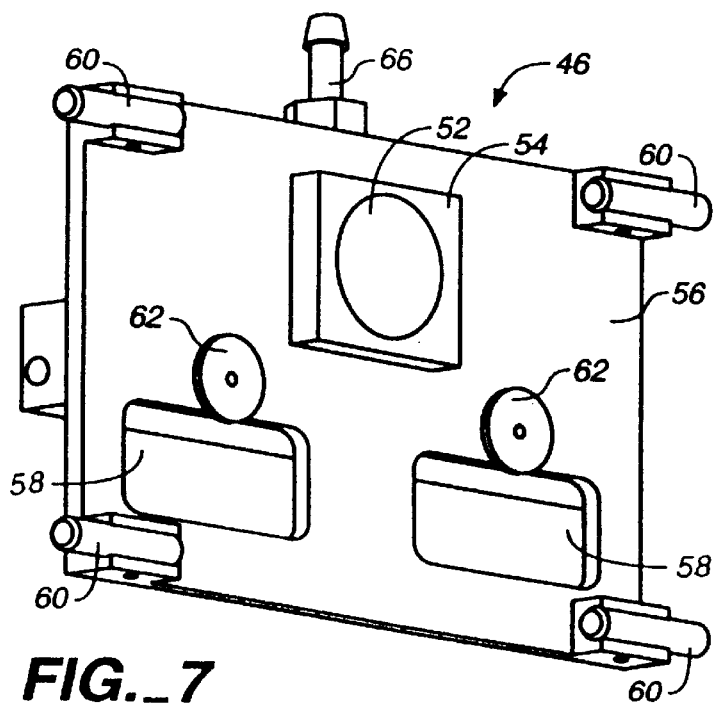
FIG._7

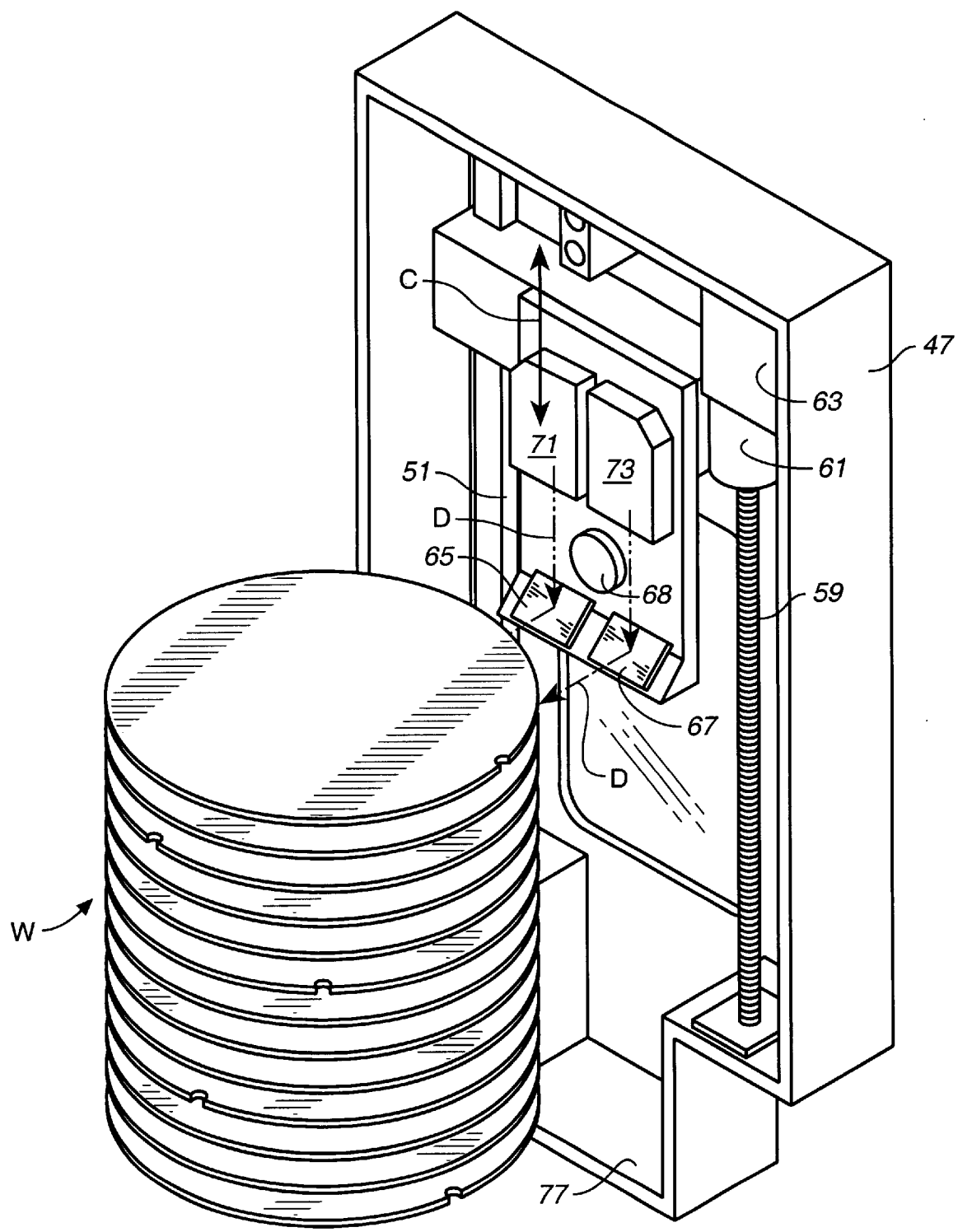
FIG._8

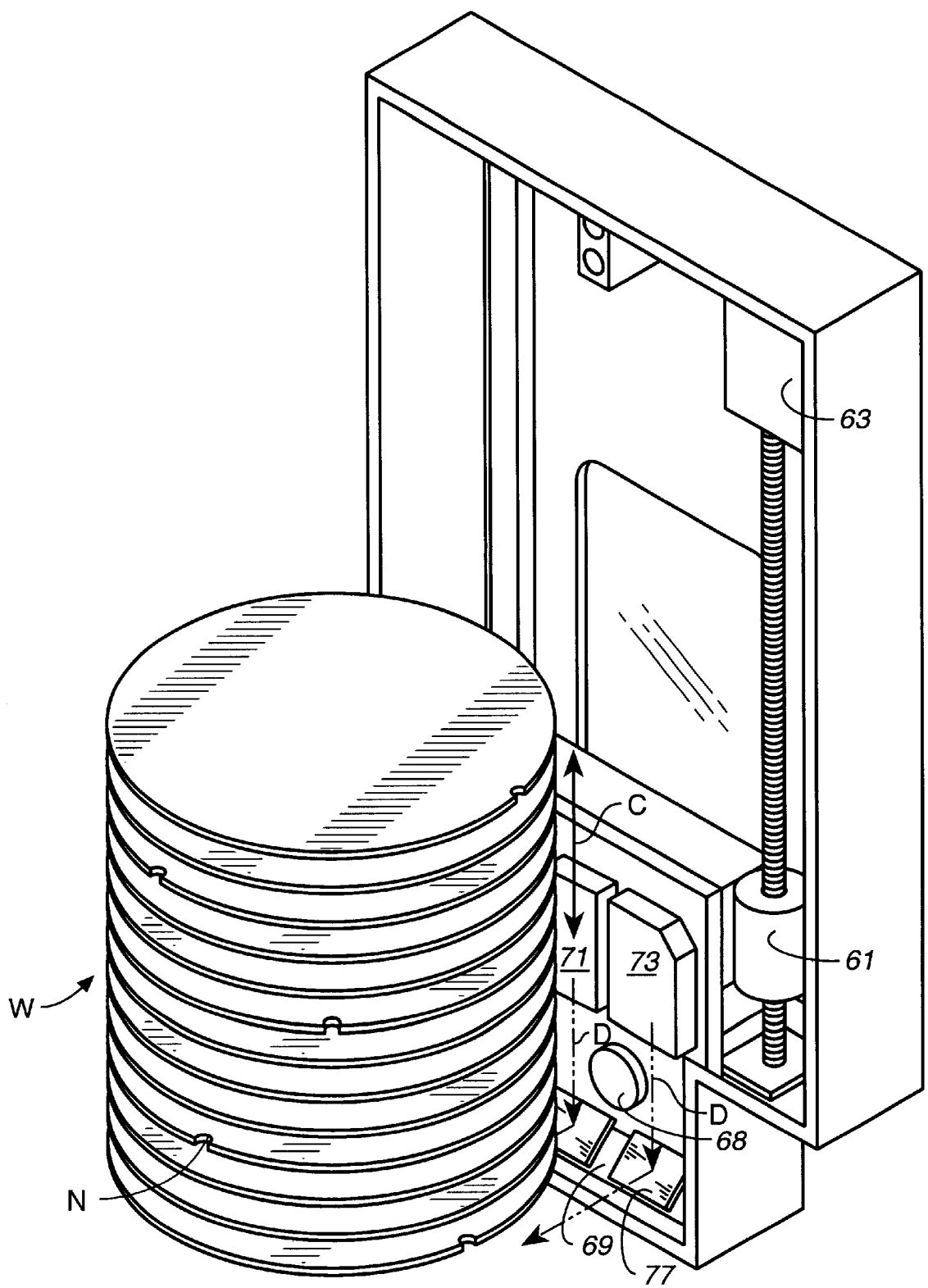
FIG._9

LOAD PORT DOOR ASSEMBLY WITH INTEGRATED WAFER MAPPER

TECHNICAL FIELD

The invention relates to electronics manufacturing equipment and, in particular, to an optical sensor for detecting objects in a manufacturing stage during a transfer operation.

BACKGROUND ART

In semiconductor manufacturing, integrated circuits are formed on silicon wafers during successive manufacturing stages involving formation and deposition of thin films on the wafers, together with selective removal of unwanted portions. To accomplish these operations, hundreds of individual steps are needed involving various pieces of process machinery, tools, measurement stations, ovens, cleaners and other equipment. Frequently, wafers are moved from one environment, such as an atmospheric pressure environment, to a different environment, such as a vacuum environment. To accomplish this, wafers are placed in cassettes or other carriers for bulk transfer and the carriers are passed through a bulkhead separating the two environments. Sometimes the carriers are sealed units, such as pods known as SMIFs (Standard Mechanical Interface) or FOUPs (front opening unified pod). Other times, the cassettes are transferred outside of sealed units because the material handling equipment does not need or use pods. For example, where a cassette is to be picked up by a robot arm, a cassette is merely transferred through a port in the bulkhead separating two environments.

In wafer handling using cassettes, it is desirable to have a wafer map indicating the number of wafers and position of the wafers within the slots of a cassette. In this patent application, the term "wafer map" refers only to number and position of wafers in a cassette. Having such a wafer map, another piece of equipment, such as a robot arm could be commanded to go to specific locations of the cassette to pick up or deposit a wafer. Without a wafer map, the robot would have to rely on its own sensors to determine whether a wafer was loaded in a particular slot of a cassette. Wafer mapping units are known. For example, U.S. patent application Ser. No. 09/038,809, by J. Gordon et al., assigned to the assignee of the present invention, discloses a wafer mapper unit for use with a FOUP (front opening unified pod). In that application, a robot arm, or end effector, associated with a load port interface, carries a wafer mapper so that wafer information can be used in connection with wafer processing and manufacturing equipment.

Although use of a wafer mapper with a FOUP is a substantial benefit, a more fundamental need exists, namely to provide a wafer mapper for use with cassettes independent of a FOUP. Yet, because of the large number of measuring instruments already in a wafer manufacturing line, most manufacturers are not enthusiastic about adding another measuring station to an assembly line, especially a tool which might be needed for repeated measurements as wafers advance along a manufacturing line from one stage to another. Accordingly, an object of the invention was to devise a wafer mapper tool for wafer manufacturing operations which would not require much additional space in a manufacturing line, yet could be used repeatedly at various manufacturing stages.

SUMMARY OF THE INVENTION

The above object has been achieved with a wafer mapper which is associated with a load port interface in a bulkhead separating different environments of a manufacturing operation. In particular, a door in the bulkhead is fashioned with front and back panels which are linked with a wafer mapper. In one embodiment, a panel acts as a box-like housing for the mapper. At the same time, at least one of the panels must seal a port in a bulkhead of a load port interface. To accomplish this the door is hinged in a manner allowing the door to be horizontal, on the operator side of the bulkhead for loading and locking of a cassette onto the door, with the wafers within the cassette in a vertically upright position. A port cover plate is connected to the door panels by an angle bracket and a pivot. The cover plate has dimensions for sealing the port in the bulkhead. The cover plate makes an L-shape relative to the panel members so that each of the cover plate and the door panels is able to seal the port in the load port interface. Upon closing the door, the door moves to a vertical position by a 90 degree rotation, sealing the port, moving the wafers to a horizontal position on the process side of the bulkhead. The wafers are held in place since the cassette is locked in place onto the door. The cassette is open at the top and bottom, being wider at the top than at the bottom, allowing optical inspection of the cassette through the top or bottom. Since the top of the cassette is now oriented horizontally, facing the back panel of the door, the optical inspection apparatus of the wafer mapper can determine wafer positions in the cassette through a window in the back panel of the door.

The wafer mapper consists of a miniature trolley, riding on a rail and driven by a leadscrew, all mounted between the front and rear panels of the door. The trolley carries a pair of beam sources, such as semiconductor lasers, as well as mirrors and optical detectors. The beam sources and mirrors direct a pair of beams onto the mirrors, then through a window in the trolley housing onto the expected position of a wafer. If light is reflected by a wafer edge, the optical detectors will detect the reflection, recording the reflected light signal from the wafers. The trolley is driven by a motor for advancing the trolley incrementally from one end of the door, say the upper end, to the opposite end of the door and then back again. An air jet on the opposite side of the window is dragged by a magnet carried by the trolley in order to clear the window of moisture droplets in the case of wet process applications or particulates in the case of dry applications. The motor is preferably a stepper motor whose motion is precisely known relative to a starting point. In this manner the known position of the trolley may be related to light reflected from individual wafers, thereby mapping the position of wafers in the cassette. The known wafer positions are recorded by a computer and passed along to other instrumentation, such as process equipment.

BRIEF DESCRIPTION OF THE DRAWINGS

FIG. 1 is a side view of a load port interface showing a wafer mapper associated with a door and a wafer cassette of the present invention, shown with the door in an open position on the operator side of the interface.

FIG. 2 is a side view of the load port interface of FIG. 1 with the door in a partially closed position.

FIG. 3 is a side view of the load port interface of FIG. 1 with the door in a closed position.

FIG. 4 is a rear perspective view of the apparatus shown in FIG. 3.

FIG. 5 is an exploded perspective view of a wafer mapper shown in FIG. 1.

FIG. 6 is a rear perspective view of a trolley used in the wafer mapper shown in FIG. 5.

FIG. 7 is a rear perspective view of an air jet follower assembly used in the wafer mapper of FIG. 5.

FIG. 8 is a perspective plan view of a wafer mapper probing wafers in a wafer stack in accord with the present invention, showing the trolley of FIG. 6 in an upper position.

FIG. 9 is a perspective plan view of a wafer mapper probing wafers in a wafer stack in accord with the present invention, showing the trolley of FIG. 6 in a lower position.

BEST MODE FOR CARRYING OUT THE INVENTION

With reference to FIG. 1, a load port interface 11 has an upright bulkhead 13 separating two environments. Typically, one environment shown on the right hand side, is operator side 14, while the opposite side of the bulkhead is process side 16. The operator side environment is typically an ambient dry environment. The process side contains wafer processing equipment, not shown, which receives wafers from the operator side for one or more out of several hundred steps involved in wafer processing. Many times the process side is a wet environment. The bulkhead 13 has a port or opening 15 which is usually kept closed, except when wafers are transferred from one side of the bulkhead to the other. Closing the port 15 is a port closure assembly 17 which includes a cover plate 19 having a seal allowing the cover plate to seal the port opening. The cover plate is pulled tight against bulkhead 13 by a latch, not shown. The pivot 23 is connected to a pivot arm 24 which transfers motion to a right angle bracket 27. One end of the bracket 27 is connected to cover plate 19 while the other end of the bracket is connected to front panel 31 of the port closure assembly. A damper 25 provides a bias to bracket 27 tending to bring the front panel 31 upwardly, with rotational motion shown by the arrow A. To guard against too rapid motion of the door assembly, the damper is connected to the bracket 27 to restrict the rate of closure and prevent slamming of the front panel 31 against the bulkhead 13. Damper 25 is insufficient to provide a closure force for front panel 31 when the panel is in the position shown in FIG. 1. The front panel rests in a horizontal position, much like an oven door. In order to raise the front panel, a handle 29 is provided so that an operator can initiate upward motion of the panel causing rotation of the cover plate 19, opening the port 15 so that a cassette 37, resting on a back panel 33 can pass through the port to the process side 16 of bulkhead 13.

The front panel 31 is part of a door 21 which includes a wafer mapper 41 which is sandwiched between the front panel 31 and the back panel 33. In the present invention, the wafer mapper 41 is shown to be part a door, being located between the front and back door panels 31 and 33. However, the mapper that could be associated with a door by resting atop a thin door and being totally outside of the door but having essentially the same configuration as shown in FIG. 1. Wafer cassette 37 is placed atop the back panel 33 and against the upright wall 35. The wafer cassette is held in place by corner bracket 36 which helps maintain wall 35 in a upright position. There are other guide members atop back panel 33 which help to locate cassette 37 in a desired position. The cassette contains wafer compartments 39 which loosely seat silicon wafers in a parallel alignment. A handle 42 on the cassette body allows an operator to push the cassette into a desired position where it is held by guides on the back panel 33.

FIG. 2 shows cassette 37 being moved from the operator side to the process side as the port closure assembly 17 is rotated in the direction of arrow B, as an operator pushes on handle 29. As cover plate 19 moves toward a horizontal position, the front panel 31 moves towards a vertical position. Cassette 37 is rotating with wafers in place. Because of slow rotation, due to the effect of the damper associated with pivot 23, the wafers remain in place.

FIGS. 3 and 4 show full rotation of the cassette 37 so that the wafer compartments 39 are now horizontal. The wafer mapper 41 is in an upright position between back panel 33 and front panel 31. The front panel may have a seal which seals the port of bulkhead 13, with the weight of cassette 37 bearing on a wall 35 to apply pressure to the seal around the periphery of front panel 31. Bracket 27 has rotated by 90 degrees and spring 25 is now in its relaxed state. The wafers held in wafer compartments 39 are now ready for mapping. In FIG. 4 a cut out region 40 may be seen in panel 33, allowing the optics of the wafer mapper to view the cassette 37.

With reference to FIG. 5, wafer mapper 41 is seen to have a front cover 43 which is shown to be removed from the back cover 47 of the wafer mapper 41. The cover 43 has a glass window 45, aligned with the cut out region of panel 33 in FIG. 4, allowing optical communication between optics within the mapper unit and a wafer stack on the process side of a bulkhead. An air jet is used on the process side of the window 45 to keep the window free of droplets of liquid. The front cover 43 is joined to a back cover 47 which acts as a box housing for the mapper components. One of the main components is a moveable trolley 51 which is supported on one side by a rail 53 and driven on the other side by a leadscrew 59. Trolley 51 has a guide block 55 which slides over rail 53. On the opposite side of the trolley, a follower member 61 is a nut-like member threaded on the leadscrew 59. As the leadscrew turns, the follower is forced to move in one direction or the other, just as a nut would move. The leadscrew is turned by motor 63 which is fixed in place at the upper end of the leadscrew. The far end of the leadscrew is mounted in a bearing block 64 positioned so that trolley 51 moves in a straight line. The principal component of trolley 51 is a carriage 57, supported between the guide block 55 and follower 61. Carriage 57 has an angled support 69 which seats a first mirror 65 and a second mirror 67 for folding the paths of beams generated by two diode laser emitters within the first mounting 71 and the second mounting 73, respectively. Although only one emitter and detector are needed, two may be used to provide redundancy in case of failure or obstruction of one. Within each mounting is both a beam emitter and a detector of reflected light, such as a sensitive photo detector. A window 79 in the back cover 47 allows an operator on the operator side of the port in which the mapper is mounted to look into the port and observe a wafer stack to see if the apparatus is operating properly.

The trolley has its home position detected by a finger 81 which projects into a proximity sensor 87 which may be a magnetic or optical device for detecting entry of finger 81. A second sensor 75 detects the lowermost extent of trolley 51 in which the angle support 69 is fully entrant into foot portion 77 of back cover 47. Sensor 75 provides a signal to motor 63 to indicate that the motor should not attempt to advance the trolley further in the downward direction. Similarly, finger 81 when fully entrant into sensor 87 provides a signal to motor 63 that the motor should stop motion of the trolley in the upward direction.

Front cover 43 is shown with the window 45 located between a pair of vertically opposed parallel tracks 44 at opposite edges of the window. The parallel tracks serve to guide a slidable, window drying, air jet assembly 46. The air jet assembly is pulled by magnet 68 on the trolley 51 on the opposite side of cover 43. An air hose 48 supplies air to the air jet assembly to blow away moisture particles which may come from any wet process on the process side of the door or particulate matter from any dry process. Such moisture particles can cause refraction of light from the beam emitters on the trolley. Refracted light could cause a misreading of the reflected optical signal coming from a wafer edge or surface, causing a system error. By removing moisture particles, this source of error is eliminated.

In the back view of FIG. 6, the guide block 55 may be seen to have generally U-shaped members for grabbing the rail 53, FIG. 5. Finger 81 is seen to project upwardly, above the guide blocks 55. The U-shaped members of the guide block may be inwardly convergent to provide for positive gripping of the rail. The angle support 69 is seen to project downwardly and away from a base 70 which carries the first beam mounting member 71. The leadscrew follower 61 is seen below motor 63. A pair of guide plates 72 and 74 help maintain parallel alignment of the leadscrew with the rail. The guide plates barely clear the back wall of the back cover of the mapper unit and are of primary assistance in positioning of the carriage 57 on initial installation on the rail 53 and leadscrew 59.

In FIG. 7, the back side of the slidable air jet assembly 46 is seen to have a magnet 52 in a carrier 54 mounted to plate 56. The magnet has a polarity which engages an opposite polarity of the magnet 68 carried by trolley 51 in FIG. 5. The magnets are strong enough so that motion of trolley 51 causes the same motion of wiper assembly 46 on the opposite side of the window 42 due to linkage of the magnet fields of the two magnets through window 42. Plate 56 has track followers 60 projecting outwardly at corners of the plate in positions which will slide within the parallel tracks on opposite sides of the window. A pair of air jets 62 receive clean dry air, or any dry gas compatible with the process being carried out on the process side of the window, at moderate pressure from the hose attached to gas inlet nozzle 66 and direct the dry gas in cone or fan shaped patterns toward the window. By the time the gas patterns reach the window, the patterns have overlapped, forming a single, merged air jet which will clear the window of moisture or other particles. A pair of cut out regions 58 serve as apertures allowing the beams from the beam emitters to pass through the plate and for reflected light to reach the detectors in the immediate vicinity of the air jet.

In FIG. 8, the trolley 51 is seen in a upper position with motor 63 at the top of the back cover 47. Note that the trolley cover is not shown in FIGS. 8 and 9 for purposes of explanation of the operation of optical members carried by the trolley. The trolley will move in the direction indicated by the arrow C. Optical beams indicated by a letter D, project into the wafer stack at a angle established by the first and second mirrors 65 and 67. The two mirrors are inclined at the same angle. These mirrors direct the beams, D, to impinge upon wafers in the wafer stack, W, at a small angle of incidence, preferably only a few degrees. At this low angle of incidence, there will be a moderate amount of reflectance of the beam from the wafer edge. If there is no reflection detected, a computer to which the optical detectors are connected may assume that a wafer is missing from the wafer stack. The wafer cassettes are precisely manufactured such that the positions of wafer holding slots are generally known. The objective of the wafer mapper is to determine whether or not wafers are in all of the slots of the cassette or whether some wafers are missing.

Since the trolley 51 has a known starting position and since the motor 63 is a stepper motor which advances the trolley in known increments, the position of the trolley is precisely known. The beam from the trolley essentially scans the wafer stack W, recording the presence of signal and the absence of signal. A more mathematical treatment of the data is set forth in patent application Ser. No. 09/038,809 filed Mar. 11, 1998 in the name of J. Gordon et al., assigned to the assignee of the present invention and incorporated by reference herein. Such a mathematical treatment of the data is optional.

In FIG. 9, the trolley 51 has descended to the lower limit of travel in which the angle support 69 is at the limit of the foot portion 77 the first and second mountings 71 and 73 generate beams D which are below the lower most wafer in the wafer stack W, thereby completing reflectance signals from the wafers. The motion of trolley 51 may now be reversed, with a trolley moving upward. Another series of measurements may be made of the wafer stack as the trolley moves to its home position at the top of the cover. The measurements made going up are compared with the measurements made going down to confirm wafer positions within a wafer stack of a cassette.

It is possible to use the beams to gather information about the wafers, other than presence and absence in a stack. For example, each wafer in a stack is seen to have a notch, N. The notch is an alignment device. If wafers are prealigned, with all notches in similar positions, it is possible to gather information about the wafer which is sometimes printed on the wafer with readable characters or bar code. The optical reading of indicia or bar code is done with CCD array detectors looking at a reflected signal. Similarly, dirt on a wafer may be judged by the quality of the backscatter signal and the information content within the backscatter signal. With a low angle of illumination, the backscatter signal is optimum.

What is claimed is:

1. A load port interface structure in a bulkhead separating a process environment from an operator environment comprising, spaced apart front and back door panels connected together as a cover for a port in a bulkhead of a load port interface, the back panel having a window therein, a wafer stack disposed in optical communication with the window, and a wafer inspection unit associated with the door panels and having a beam source and a beam detector, the beam passing to and from the wafer stack relative to the inspection unit through the window.

2. The apparatus of claim 1 wherein the wafer stack is an arrangement of wafers in a cassette supported by the back panel of the door.

3. The apparatus of claim 2 wherein spaced apart guide members establish a position of said cassette.

4. The apparatus of claim 1 wherein the wafer inspection unit is mounted for motion along the wafer stack on a carriage supported by at least one rail and driven by a leadscrew.

5. The apparatus of claim 4 wherein the wafer inspection unit comprises a beam source and an optical detector.

6. The apparatus of claim 5 wherein the wafer inspection unit comprises a wafer mapper unit.

7. The apparatus of claim 1 further defined by a cover plate connected to the door panels by an angle bracket, the cover plate having dimensions for sealing the port in the bulkhead.

8. The apparatus of claim 7 wherein the cover plate is connected to the door panels forming an L-shape having a pivot for rotation of the connected members whereby each of the cover plate and the door panels is able to close the port in the load port interface.

9. The apparatus of claim 8 wherein the wafer cassette is mounted next to the wafer mapper and rotates through the port in the load port interface from one side of the interface to the other side.

10. The apparatus of claim 1 wherein the wafer inspection unit is mounted between the door panels.

11. The apparatus of claim 1 wherein a movable air jet in magnetically coupled to the wafer inspection unit on the opposite side of the window therewith.

12. A door assembly for a load port interface comprising, a port cover plate and a front door panel disposed in an L-shape configuration and connected by a bracket, the cover plate and door panel mounted for rotation through an angle whereby either the port cover plate or the front door panel closes a port of the load port interface, an open top wafer cassette containing a wafer stack supported for movement with the front door panel, whereby rotation of the front door panel brings about rotation of the wafer cassette, and a wafer mapper unit connected to the front door panel having a beam source directing a beam into the wafer stack through a window in the front door panel and the open top of the wafer cassette and a light detector receiving light from the wafer stack, the beam source and light detector mounted on a trolley moveable parallel to the wafer stack.

13. The apparatus of claim 12 wherein the front door panel is a box shaped housing mounting the trolley on parallel linear members.

14. The apparatus of claim 13 wherein one of the parallel linear members is a leadscrew.

15. The apparatus of claim 12 wherein the beam source is a laser.

16. The apparatus of claim 12 wherein the light detector is a reflected light detector.

17. The apparatus of claim 13 wherein the trolley supports a mirror means for folding the path of the beam between the source and the wafer stack.

18. The apparatus of claim 13 wherein the trolley has a movable air jet on the opposite side of the window coupled to the trolley.

19. The apparatus of claim 12 where the trolley includes a sensor capable of indicating a start position for the trolley.

20. The apparatus of claim 12 wherein the trolley includes a second sensor capable of indicating a stop position for the trolley.

21. A load port interface structure comprising, a bulkhead with a window having a process side and an operator side, the process side having a wafer stack adjacent to the window, a wafer inspection unit associated with the bulkhead adjacent to the window on the process side, the inspection unit having a trolley movable over the window, the trolley carrying a beam emitter directing a beam through the window toward the wafer stack and having a beam detector positioned to detect light coming from the beam detector, and a movable air jet adjacent to the window on the process side, the air jet magnetically coupled to the trolley through the window and movable with the trolley.

22. The apparatus of claim 21 wherein the bulkhead has a door and said wafer inspection unit is mounted inside of the door.

* * * * *